United States Patent [19]

Miller

[11] Patent Number: 5,745,512
[45] Date of Patent: Apr. 28, 1998

[54] TUNABLE LASERS BASED ON ABSORBERS IN STANDING WAVES

[75] Inventor: David Andrew Barclay Miller, Fair Haven, N.J.

[73] Assignee: Lucent Technologies Inc., Murray Hill, N.J.

[21] Appl. No.: 528,800

[22] Filed: Sep. 15, 1995

Related U.S. Application Data

[63] Continuation of Ser. No. 55,492, Apr. 30, 1993, abandoned.
[51] Int. Cl.$^6$ ........................................................ H01S 3/10
[52] U.S. Cl. ........................... 372/20; 372/32; 372/11; 372/50
[58] Field of Search ............................... 372/11, 20, 18, 372/32, 45, 46, 44, 50

[56] References Cited

U.S. PATENT DOCUMENTS

| | | | |
|---|---|---|---|
| 4,269,481 | 5/1981 | Yeh et al. ........................ | 372/105 X |
| 4,573,156 | 2/1986 | Anthony et al. ................. | 372/44 X |
| 4,749,850 | 6/1988 | Chemla et al. .................. | 250/211 |
| 4,860,296 | 8/1989 | Chemla et al. .................. | 372/11 X |
| 5,008,893 | 4/1991 | Amann et al. ................... | 372/20 X |
| 5,088,097 | 2/1992 | Ono et al. ....................... | 372/20 |
| 5,202,897 | 4/1993 | Whitehead ...................... | 372/92 |
| 5,305,343 | 4/1994 | Allovon et al. .................. | 372/50 |
| 5,408,486 | 4/1995 | Shoji ............................... | 372/45 |
| 5,416,338 | 5/1995 | Suzuki et al. ................... | 372/50 X |

FOREIGN PATENT DOCUMENTS

| | | | |
|---|---|---|---|
| 0121987 | 5/1989 | Japan . | |
| 0311689 | 3/1991 | Japan . | |
| 04247676 | 3/1992 | Japan ............................... | 372/45 |
| 04284105 | 10/1993 | Japan . | |

*Primary Examiner*—Rodney B. Bovernick
*Assistant Examiner*—Hemang Sanghavi
*Attorney, Agent, or Firm*—Gregory C. Ranieri

[57] ABSTRACT

A tunable laser whose lasing frequency can be changed by varying the absorbance of absorber layers that are preceding a standing wave of the laser cavity. Changes in the absorbance of the layers are accomplished by varying the strength of the absorber layers through application of voltage to the layers.

9 Claims, 8 Drawing Sheets

TUNABLE LASERS BASED ON ABSORBERS IN STANDING WAVES

This application is a continuation of application Ser. No. 08/055,492, filed on Apr. 30, 1993, now abandoned.

TECHNICAL FIELD

This invention relates to tunable lasers. More specifically, this invention relates to tunable lasers using absorptive elements.

BACKGROUND

Tunable lasers are increasingly finding specialized use in a wide variety of applications, such as spectroscopy and metrology. Use of tunable lasers is likely to be expanded in the near future because of recent technological breakthroughs that are very likely to lead to the use of tunable lasers as an apparatus for a) optical modulation and switching, and b) wavelength division multiplexing in diverse applications, such as information processing and networking.

The potential expanded technological base for tunable lasers has raised the hope that a resulting increase in tunable lasers' volume of production would lead to economies of scale that may cause a reduction in their cost. That cost reduction in turn, would allow optical devices or optoelectronic devices incorporating tunable lasers as one of their components, to compete against other technologies' devices on the basis of price in additional markets. That self-fueling cycle of increased production and cost reduction for tunable lasers requires design versatility and flexibility for those lasers in order to meet the diverse requirements of different markets. More specifically, tunable lasers have to be simply controllable and rapidly adjustable to desired wavelengths.

Unfortunately, market penetration of tunable lasers is inhibited by the limitations of existing tunable lasers. One of the limitations of conventional tunable lasers relates to the tuning technique of controlling lasers' wavelength by combining in a non-integrated fashion, semiconductor-based lasers with optical filters that are typically hard to adjust rapidly. The problem associated with the difficulty of laser's rapid adjustment also exists with tuning techniques that rely on mechanical adjustment of the angle of a grating or prism. The non-integrated merger of the laser electronic components with the filtering device optical components and/or the mechanically adjusted gratings or prism prevent the creation of readily manufacturable, cost-effective Opto Electronic Integrated Circuits (OEIC) that incorporate tunable lasers.

Newer laser tuning techniques have overcome to a certain extent, the integration deficiencies mentioned above, by controlling the lasers' wavelength through changes in the refractive index of a material inside the laser. However, those newer techniques present some undesirable characteristics that limit the scope of usage of tunable lasers. For example, these techniques are constrained by the difficulty of making large refractive index changes when the refractive index is electrically controlled. Other laser tuning schemes that rely on special physical effects of materials, such as surface plasma modes, are often restricted to specific spectral regions. Thus, a problem of the prior art is the lack of a cost-effective tunable laser that can be simply controlled and rapidly tuned and therefore, suitable for mass market use.

SUMMARY

This present invention is directed to a tunable laser whose wavelength is controllable through changes in the absorbance of absorbing materials placed in the laser cavity. In accordance with the invention, changes in the absorbance of the materials are accomplished through variations, for example, in the absorption strength of the absorbing materials in the laser cavity.

In a preferred embodiment of the invention, layered semiconductor structures, such as quantum wells inside p-i-n-diodes, are placed into a standing wave pattern formed by the interference of beams in the laser cavity. Taking advantage of lasers' tendency to run at wavelengths that minimize loss or more specifically, that give the largest difference between gain and loss, the layered structures are placed at positions that constrain the laser to run at a wavelength that gives nodes (i.e., standing wave minima) at points between pairs of adjacent layers. In a two-layer configuration where the layers are of equal absorbance, the node will be at an equidistant point between the layers. In response to a change in the absorbance of one of the layers or both, the laser automatically selects a new wavelength that minimizes loss. Hence, changes in the absorbance of one of the layers or both, cause the wavelength of the laser to be modified thereby allowing the laser to be tuned to particular wavelengths. Changes in the absorbance of the layers can be accomplished, for example, by applying voltage across at least part of the semiconductor structures to influence an electroabsoptive effect in those structures.

Alternatively, absorbance and hence, wavelength control can be achieved by having gain regions (i.e., regions of negative absorption). In that case, the laser would tend to run at a wavelength for which, the antinodes of the standing wave pattern coincide with the gain regions. This embodiment can be further extended to include both positive and negative absorbers, with the laser then trying to run with nodes at the (positive) absorbers and antinodes at the gain (negative absorption) regions. By controlling the absorption (positive or negative) in particular layers, the wavelength at which the structure has minimum loss (or, equivalently, maximum gain) can be controlled, thereby controlling the laser's wavelength.

Other aspects of a related wavelength control technique, as applied to an optical detector, are discussed in the commonly assigned co-pending U.S. patent application Ser. No. 08/055,487 entitled "Wavelength-Sensitive Detectors Based on Absorbers in Standing Waves".

DETAILED DESCRIPTION

Figure 1:
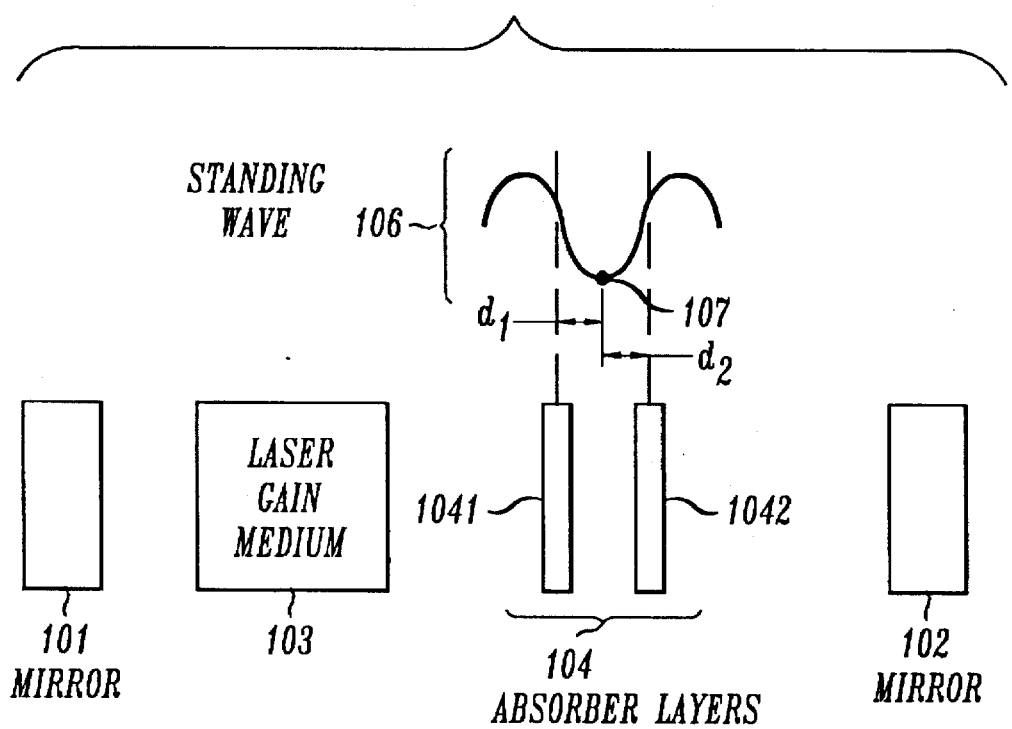
FIG. 1 is an illustrative representation of a tunable laser with a longitudinal layered structure designed in accordance with the invention, to control the wavelength of the laser.

FIG. 1 is an illustrative representation of a tunable laser with a layered structure designed, in accordance with the invention, to control the wavelength of the laser. The tunable laser of FIG. 1 comprises a) a front mirror 101 which receives light input emitted from the laser gain medium 103, and b) a rear mirror 102 which may be made to be partially reflecting, and through which may flow the output of the laser. The light input received by mirror 101 is propagated back through laser gain medium 103 and is reflected off mirror 102 to form forward and backward waves in the laser cavity that is defined by the area between mirrors 101 and 102. Absorber layers 104 which may be, by way of example, semiconductor layered structures, such as quantum wells inside p-i-n diodes, are placed at specific positions in the path of the forward and backward waves. For simplicity, two absorber layers 1041 and 1042 are shown in FIG. 1, even though a structure with more than two layers can also be used. Because of lasers' tendency to run under conditions of minimum loss, the laser will tend to run at wavelength that gives nodes or minima in the standing wave pattern 106 at positions that minimize absorption. When absorber layers 1041 and 1042 are of equal absorbance, the standing wave pattern 106 minimum shown at point 107, is equidistant from 1041 and 1042. Thus, by adjusting the relative absorbance of layers 1041 and 1042 in absorber layers 104, the form of the standing wave pattern that minimizes loss can be changed, thereby permitting control of the laser's wavelength.

An illustrative implementation of a selectable wavelength laser using the structure of FIG. 1 may shed some light on the control system of the tunable laser. In the laser of FIG. 1, absorber layers 1041 and 1042 can be controlled by voltage. By varying the voltage in absorber layers 1041 and 1042, the absorbance of the layers is modified resulting in a new wavelength as the laser adjusts to the new absorbance of the layers to minimize loss.

In FIG. 1, absorber layers 1041 and 1042 are shown as single layer absorbers. Those absorbers can alternatively be replaced by longitudinal gratings of absorbing sections where each grating consists of a set of equally spaced layers of controllable absorbers. In that case, by turning on a specific grating of absorber layers in specific absorbing section(s) and turning off the grating of absorber layers in other absorbing section(s), the absorbance of the layers in absorber layers 104 can be controlled. Hence, the wavelength of the laser would be set by the spacing of the absorbers in the energized section. More specifically, the selective energizing of specific absorbing sections coupled with a particular spacing of layers in the energized section allows a user to choose which of several pre-determined wavelengths in the tunable laser would lase. Absorber layers 104 in this particular implementation can be made with several stacked p-i-n diodes, each one containing one or more absorbers within its intrinsic (i) region. Alternatively, absorber layers 104 could be made with a transverse grating structure (discussed below) with several different absorbing gratings, each of which could be separately turned on or off.

Figure 2:
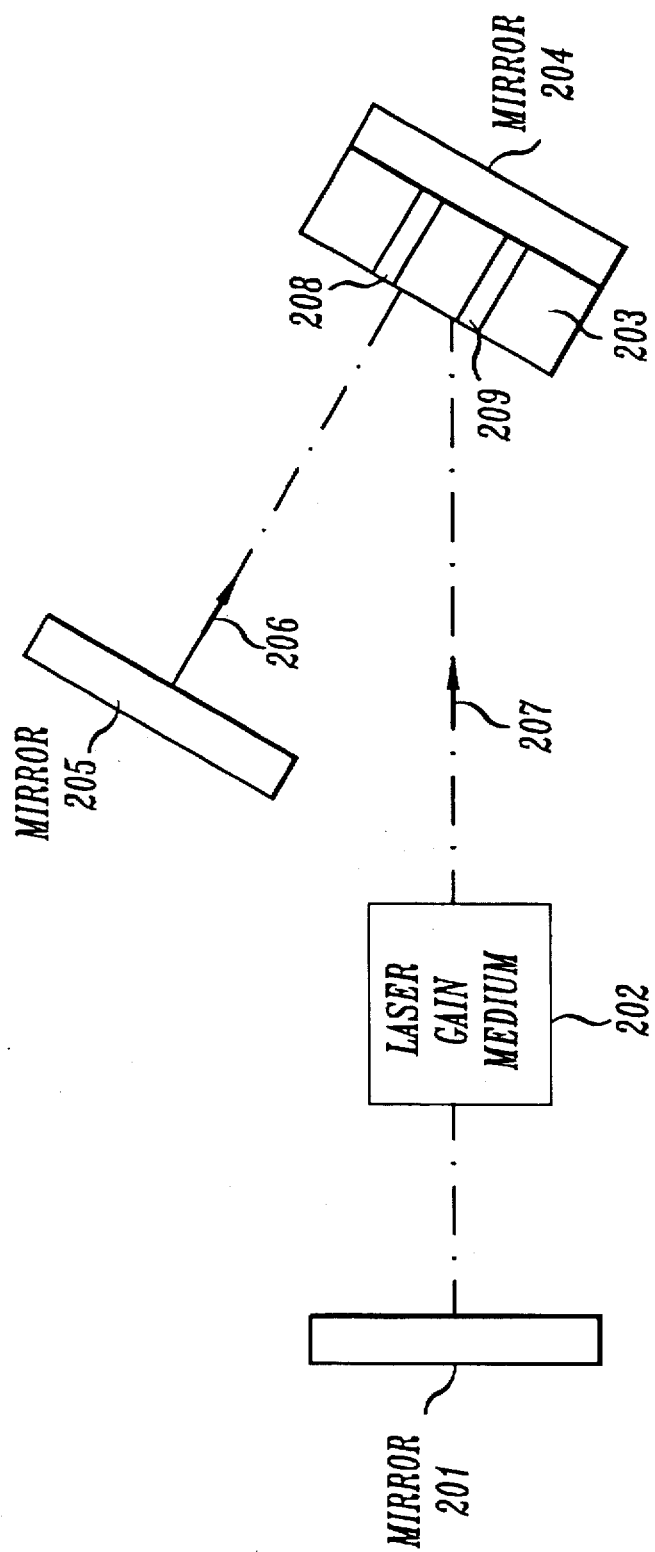
FIG. 2 is an illustrative representation of a tunable laser with a transverse layered structure in accordance with the invention to control the wavelength of the laser.

FIG. 2 is an illustrative representation of a tunable laser with a transverse layered structure designed in accordance with the invention, to control the wavelength of the laser. The tunable laser of FIG. 2 has three mirrors 201, 204 and 205 which reflect light beams 206 and 207 that are propagating at an angle to each other and incident to transverse grating structure 203 which has two absorbing sections 208 and 209. The interference of beams 206 and 207 results in a transverse interference pattern being formed in which different points on absorbing sections 208 and 209 correspond to different points on a standing wave pattern (not shown). More specifically, the absorption level within the absorbing sections 208 and 209 will be different at different positions, with stronger absorption chosen to coincide with specific parts of the standing wave as shown in FIG. 1. Thus, the intensity in the standing wave pattern varies laterally within the absorbing sections 208 and 209 (as discussed below in the description of FIG. 4).

Advantageously, the transverse grating structure 203 affords larger spacing of the nodes and antinodes, thereby allowing complex structures of absorbers to be fabricated by conventional lithography. It may also be easier with the transverse grating structure 203 to make separate connections to each of the absorbing sections 208 and 209, using, for example, standard lithographic techniques. Moreover, the transverse grating structure 203 is particularly well suited for tuners that need a large number of absorbers, such as tuners with narrow bandwidths or tuners with many preset tuning sections to be turned on and off. In general, it is easier to make devices requiring many separate connections to layers or sets of layers in the transverse configuration of FIG. 2 as opposed to the longitudinal configuration of FIG. 1, because only a single lithographic step is required to define these many separate connections.

Figure 3:
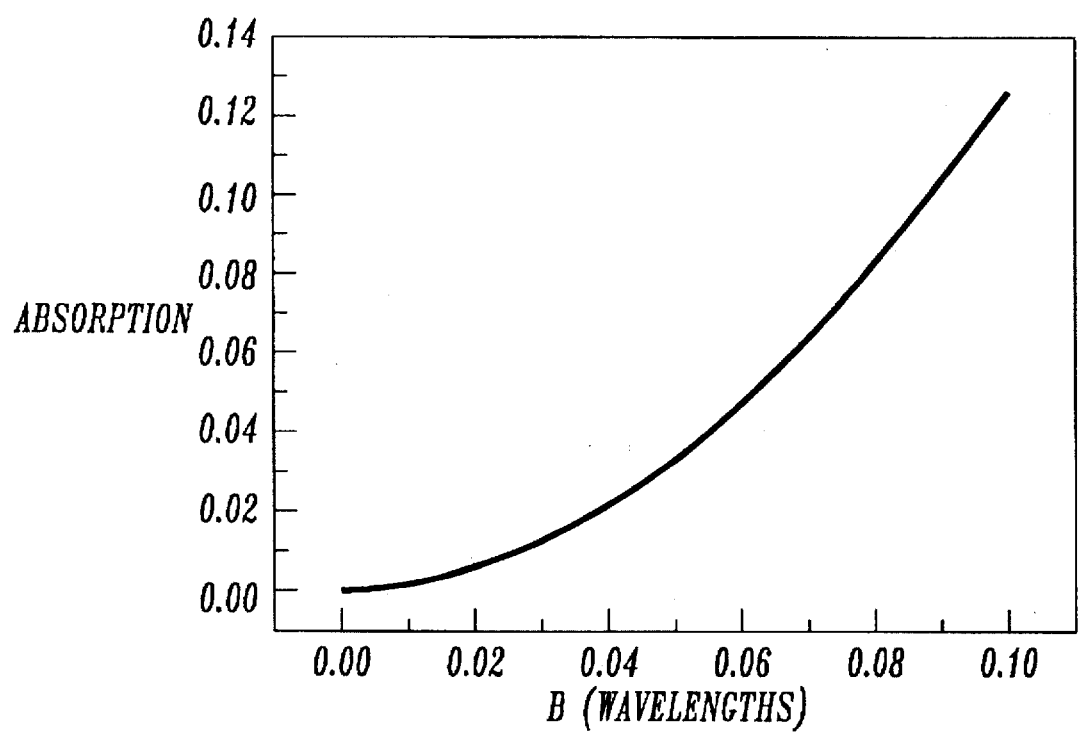
FIG. 3 is a curve representing an algebraic relation between the absorption and the thickness of the absorber layers for a longitudinal layered structure.

FIG. 3 is a curve representing an algebraic relation between the absorption of a layer positioned at a node and the thickness of the absorber layers in a layered longitudinal grating structure. On the y-axis of FIG. 3, absorption is measured in units of the absorption that would occur for a single beam incident to the absorber layers. The curve of FIG. 3 shows the minimum loss that is possible for a given thickness of absorber, with absorber thickness expressed in units of wavelengths.

In order to design absorbing structures to implement this invention, it is desirable to use mathematical models to calculate the loss for those structures. One such model uses a two-phase approach. In a first phase, the absorbance of absorber layers 104 of FIG. 1 is assumed to be negligible when the standing wave pattern 106 of FIG. 1 is calculated. In the second phase, the total absorption based on that standing wave pattern within the absorbers is calculated. Hence, the model leads to accurate results in the case of very small absorption in the absorbing layers. The simplest version of such a model assumes that a) the refractive index is the same in the absorbing and non-absorbing layers, and b) any reflection due to the absorbing nature of the layers is negligible. The model purposely minimizes the fact that there is always some reflection off an absorbing material, regardless of its refractive index. The basic results are not significantly affected when all the assumptions are discarded.

Let us take the simple example of a 100% reflecting mirror (such as mirror 101 of FIG. 1), with no phase change on reflection off the mirror. In that case, the standing wave intensity pattern for a monochromatic wave of wave vector k in the positive z direction can be represented by the equation:

$$I(z) = 2I_0(1 + \cos 2kz), \quad (1)$$

where we have chosen $z=0$ at the position of the mirror. For zero phase change on reflection, an antinode occurs at the mirror surface.

Equation (1) can be used to calculate the loss when an absorber of finite thickness is placed at a node in a standing wave pattern. Such a calculation provides a good idea of how thick the absorbing layers can be made in practice since a minimal loss condition is the common operating mode for most tunable lasers.

To calculate the actual loss for a single absorber in a standing wave, let us assume that a) the absorbing layer has an absorption coefficient a and thickness coefficient b, and b) the total absorption for a unidirectional beam propagating through the layers would be A=ab. Thus, for an absorber centered at position $Z_b$, the actual loss in the standing wave will be, in this model, $$L = 2\alpha \int_{z_b - b/2}^{z_b + b/2} (1 + \cos 2kz) dz = 2\alpha \left[ b + \frac{1}{k} \sin kb \cos 2kz_b \right]. \quad (2)$$

Hence, for an absorber positioned exactly at an antinode (cos $2 kz_b = +1$ in this case), the absorption is 4 A. The factor of 4 comes from two factors of 2, one of which is due to the fact that we have beams of unit intensity propagating in both directions (so that the average overall intensity is 2 units), and the other factor of 2 comes from the standing wave effect. This relation, (Equation 2) is the algebraic relation that is plotted in dimensionless units in FIG. 3 for the case of an absorber centered exactly at a node (in this case cos 2 $kz_b = -1$), Absorption is in units of the absorption of the layer for a unidirectional beam (i.e., in units of A=αb). Thickness is in units of wavelengths (inside the material), for the case of a longitudinal grating. When the absorber is exactly centered on a node, the resulting absorption is, to lowest order in k, $$L_{node} = \frac{\alpha k^2 b^3}{3} = \frac{4\pi^2}{3} \frac{\alpha b^3}{\lambda^2}. \quad (3)$$

where λ is the wavelength. For example, for a medium of refractive index 3.5, with an absorbing layer thickness of 10 nm, and a (free-space) wavelength of 850 nm (numbers appropriate for a GaAs quantum well as the absorber in an otherwise AlGaAs structure), the absorber is approximately 0.041 wavelengths thick (measured in wavelengths inside the material), and the actual absorption in the layer at the node will be $$L_{node} \approx 0.022 \, A \quad (4)$$

where A=αb would be the single pass loss for a unidirectional beam passing through the same absorber. This calculation illustrates that such quantum wells would be well suited to such longitudinal structures, since they would be sufficiently thin to have little absorption when placed at a node.

Although the curve of FIG. 3 is plotted for a longitudinal grating structure, it can also be used to approximate the absorption for a transverse grating structure. In that case, the unit of b is the "wavelength" of the interference pattern, which is twice the repeat distance of the intensity interference pattern, and the absorptions are given for a "two-beam" interference case.

Figure 4:
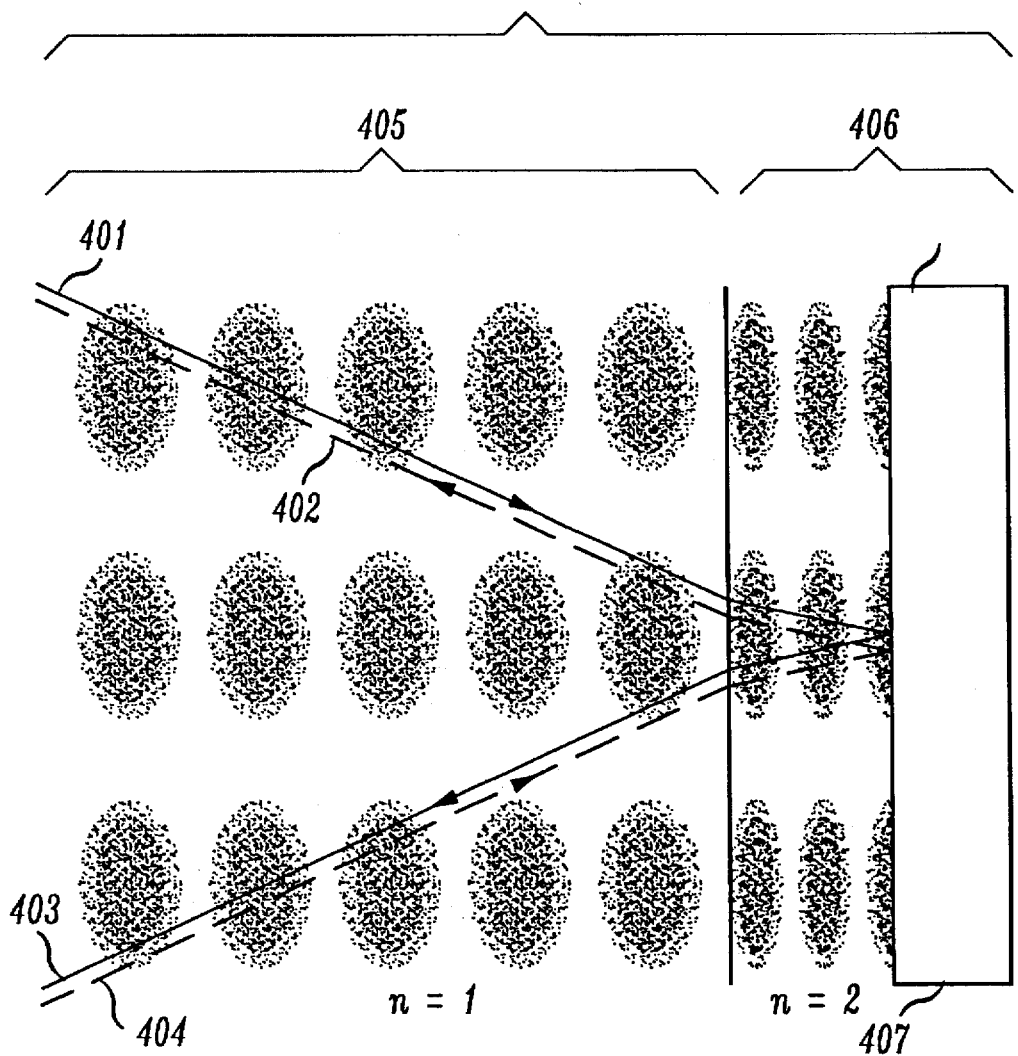
FIG. 4 illustrates the form of a standing wave pattern for a transverse grating structure with two pairs of counter-propagating beams.

FIG. 4 illustrates the form of a standing wave pattern for a transverse grating structure with two pairs of counterpropagating beams. In FIG. 4, counterpropagating beams 401, 402, 403 and 404 are reflected off mirror 407 passing through materials 405 and 406 of refractive indexes 1 and 2, respectively. The darker regions of FIG. 4 correspond to higher intensity points in the standing wave pattern. FIG. 4 also shows the changes in the wave pattern as the beams traverse through materials 405 and 406. Although the angles of the beams are changed in passing through the two materials, the spacing of the transverse interference pattern is not affected. By contrast, the longitudinal pattern does change as indicated by the shorter horizontal distances between the darker regions of FIG. 4. This sensitivity to the position of the longitudinal maxima in the interference pattern in the four-beam case indicates that the phase change on reflection from mirror 204 in FIG. 2 is of particular importance since that phase change affects the optimum positioning of thin absorber layers relative to the mirror 204.

Figure 5:
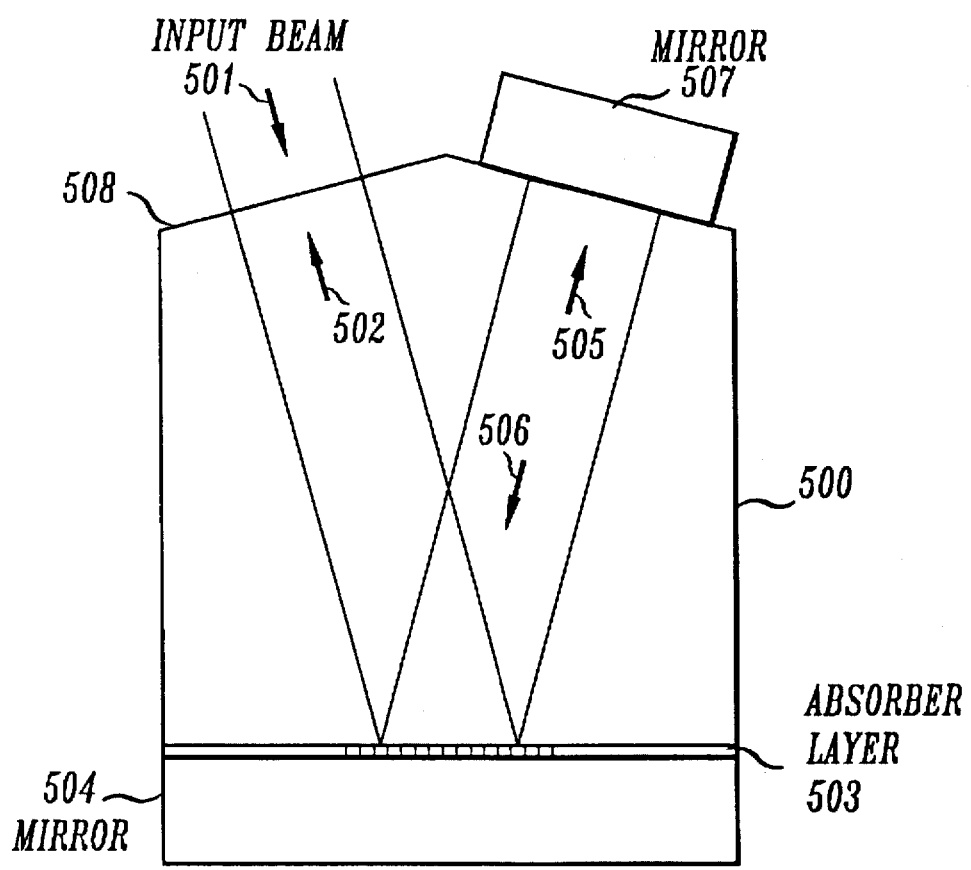
FIG. 5 shows an exemplary prism structure that can be used with a transverse absorption grating for a tunable laser.

FIG. 5 shows an exemplary structure that can be used with transverse absorption gratings as a laser tuner. In FIG. 5, input light beams 501 and 502 enter the structure 500 via surface 508. Structure 500 may be, for example, a nondispersive prism structure arranged to allow wavelength sensitivity to be controlled by the absorbance of absorber layer 503. Beams 501 and 502 are reflected off a mirror 504 after traversing absorber layer 503. The reflection of beams 501 and 502 off mirror 504 generates beams 505 and 506 that are in turn, reflected off mirror 507 thereby generating a standing wave pattern (not shown) which exits structure 500 via surface 508. The solid structure 500 holds the mirrors 504 and 507 and the absorber layer 503 at fixed distances. Surface 508 of the prism structure 500 is antireflection coated and deliberately slightly misaligned so that reflections off surface 508 do not create an exact retroreflection. The misalignment avoids undesired etalon effects between surface 508 and mirror 507. The wavelength insensitivity of the action of this prism structure is due to the fact that the beams in FIG. 5 travel perpendicularly to surface 508 on entrance and exit and hence, their angles are not affected by the wavelength dependence of the refractive index of the prism material. Hence, the wavelength of the laser is controlled by the absorber rather than by any dispersive effect in the prism 500 itself.

Figure 6:
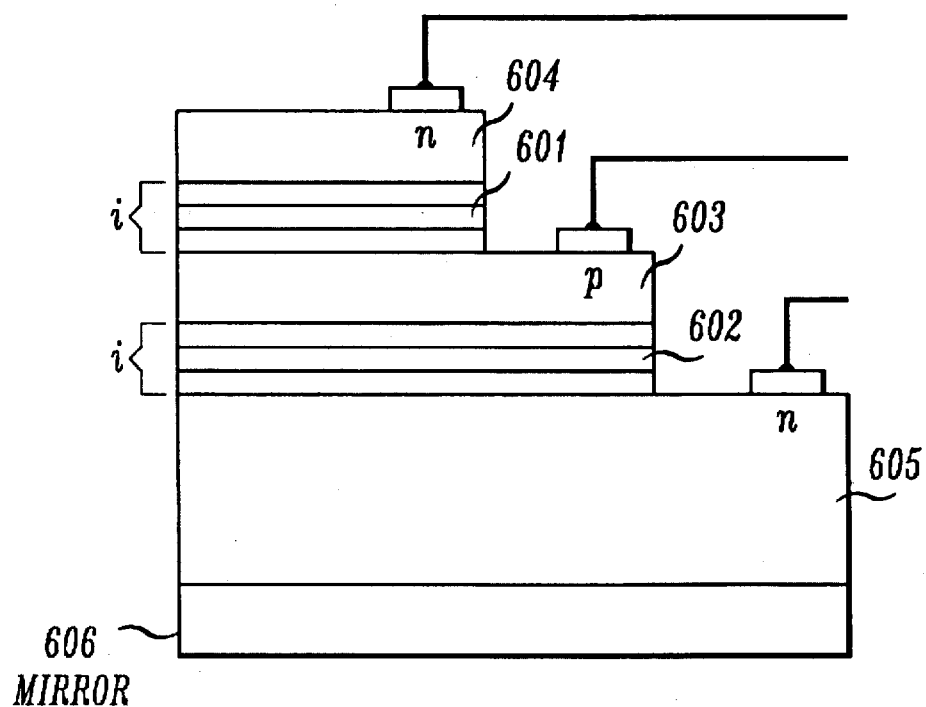
FIG. 6 is an exemplary structure for a two-absorber tunable laser.

FIG. 6 is an exemplary structure for a two-absorber tunable laser. In FIG. 6, two controllable absorbers 601 and 602 are placed in the standing wave pattern (not shown) at fixed distances relative to a mirror 606. In this example, the two absorbers 601 and 602 are p-i-n photodiodes arranged to share a common player 603 for simplicity in the structure. The absorbers 601 and 602 are contained within the intrinsic i region of the p-i-n photodiodes.

When absorbers 601 and 602 are of equal absorbance, they will be equidistant from the node of the standing wave (not shown) formed by the interference of light beams in a laser cavity as discussed above. In this example, a particular wavelength can be picked among several predetermined wavelengths by selectably energizing absorber 601 and/or 602. When the layers of absorbers 601 and 602 are quantum wells, the absorption can be controlled by changing the bias voltages on the two p-i-n diodes in the structure of FIG. 6. Changing the bias voltage changes the absorption of a given layer through the quantum-confined Stark effect in wavelength regions close to the optical absorption edge. It may also be possible to use other electroabsorptive mechanisms, such as the Franz-Keldysh effect, in semiconductor structures not exhibiting the quantum-confined Stark effect.

Although FIG. 6 shows only two absorbers, the principles of this invention are still applicable when multiple absorbers in the form of stacked p-i-n photodiodes are positioned in the standing wave. For example, it is possible to make stacked versions of such tuners, with different spacings relative to the mirror, to make more selective structures. This could use principles similar to those used for multiple plate Lyot tuners.

Figure 7:
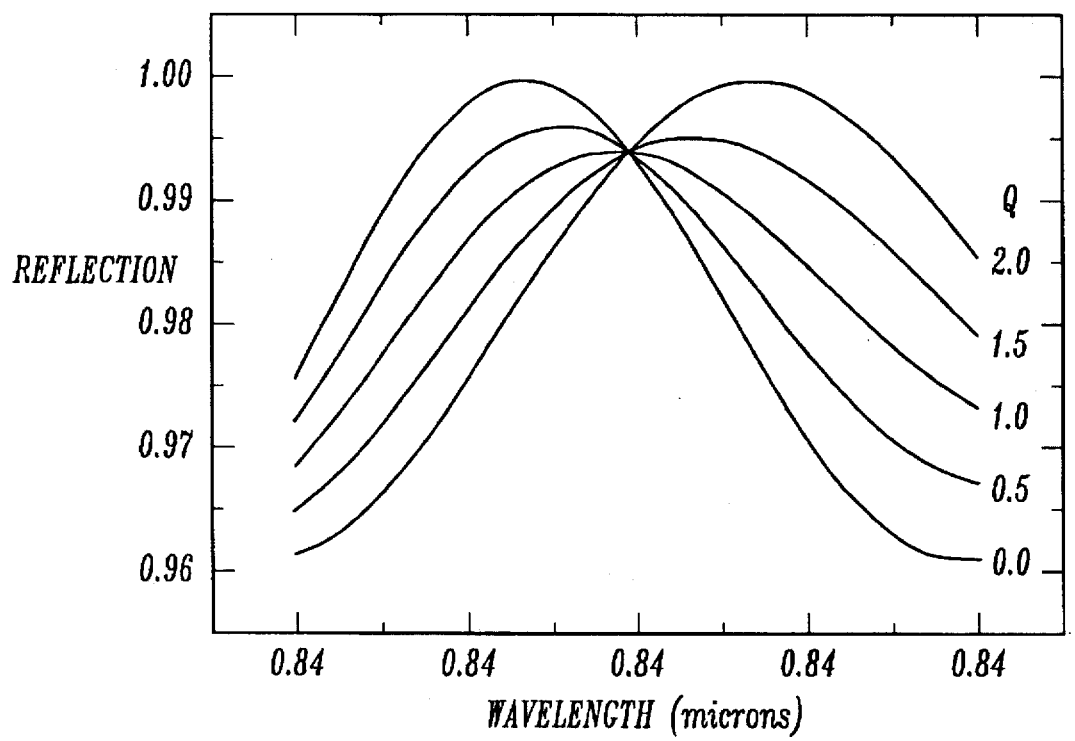
FIG. 7 shows reflection as a function of wavelength for the two-layer absorber of FIG. 6 for several different values of the relative absorption in the layers.

FIG. 7 shows reflection as a function of wavelength for the two-layer absorber of FIG. 6 for several different values of the relative absorption in the layers. In FIG. 7, the absorption in the two layers is presumed to vary linearly with some parameter Q between zero and a peak value, i.e., $$A_a = A_{1/2} Q$$

and $$A_b = A_{1/2}(2-Q)$$

where $A_a$ and $A_b$ are the (single pass) absorptions of layers in absorbers 602 and 601, respectively, and $A_{1/2}$ is half of the peak absorption of a given layer. With this choice in this particular example, Q runs from 0 to 2.

The parameter Q indexes the relative absorption in the layers. When Q=0 there is no absorption in absorber layer 601, and full absorption in absorber layer 602, and when Q=2 the opposite condition (601 absorbing and 602 not) prevails. The absorption varies linearly with Q between these extremes. As Q is varied from 0 to 2, the wavelength of maximum reflection varies from approximately 854 nm to approximately 867 nm, which indicates the likely tuning range. The peak reflection remains high (>99.3%) for all values of Q shown. In the example of FIG. 7, the specific structure of FIG. 6 has 10 nm thick absorbing layers with peak absorption coefficient of $10^4$ cm$^{-1}$. The distances from the mirror to the centers of the layers are 1.797 μm and 2.135 μm, respectively and the refractive index is assumed to be 3.5 throughout. These thicknesses correspond, at a (free-space) wavelength of 860 nm, to a distance of 8 wavelengths from the mirror to the center point between the two absorbing layers, and a separation of the centers of the absorbing layers of 11/8 wavelengths.

The tunable laser of FIG. 6 can be implemented with GaAs quantum wells as the controllable absorbers in the diode structure. In the example of FIG. 7, a tuning range of about 13 nm is provided. The absorption of a GaAs quantum well could be controlled over this wavelength region through the quantum-confined Stark effect. Incidentally, the fact that all of the curves pass through the same reflection at 860 nm (an isosbestic point) in FIG. 7 is a simple artifact of the assumption that the absorption in the two absorbers varies linearly with a constant total as shown in the equations above. At 860 nm, by design, the standing wave amplitude is equal at both absorbers, hence the total absorption is the same for all Q.

Figure 8:
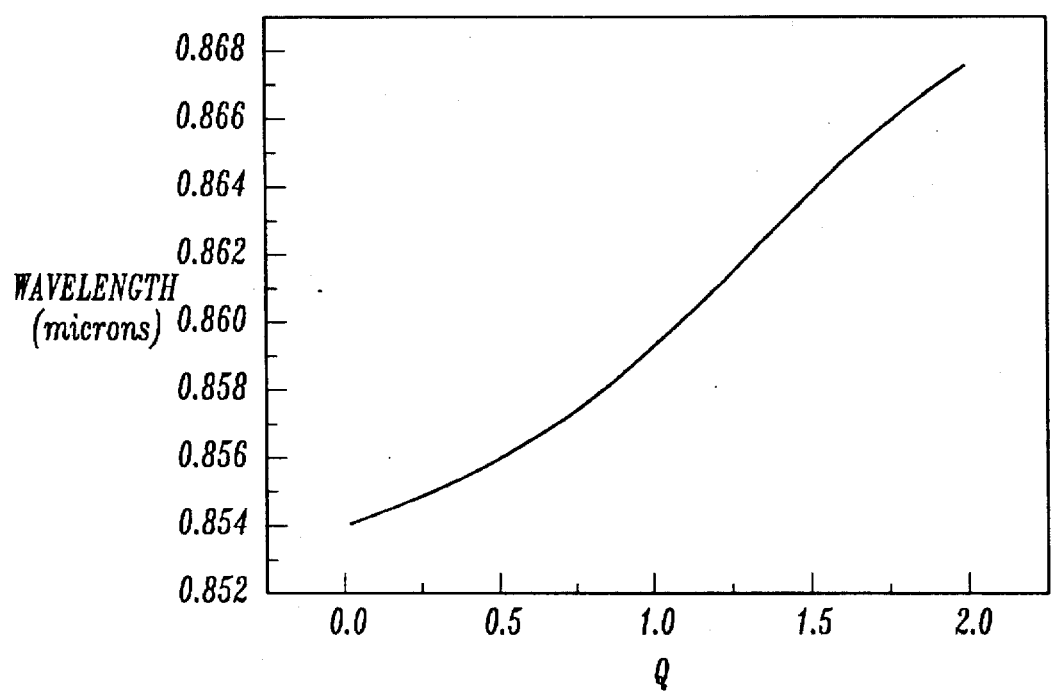
FIG. 8 shows the wavelength tuning curve for the structure of FIG. 6.

FIG. 8 shows the wavelength tuning curve for the structure of FIG. 6. In FIG. 8, Q is the parameter that varies the relative absorption in the two absorbing layers. For a Q between 0 and 2, FIG. 8 shows the different wavelengths to which the structure of FIG. 6 can be tuned.

I claim:

1. A tunable laser comprising
    at least two reflective elements (101 102) defining a laser cavity supporting a predetermined lasing frequency;
    a multiple layer semiconductor structure placed into a standing wave pattern formed by interference of light beams in the laser cavity, the multiple layer structure having at least one of positive absorptive layers and negative absorptive layers and being placed into the standing wave pattern at positions that constrain the laser to lase at a wavelength that causes at least one of standing wave minima at points between adjacent positive absorptive layers and standing wave maxima at points between pairs of negative absorptive layers; and
    means for varying the absorbance of at least one absorptive layer to change the form of the standing wave pattern and thereby change the lasing frequency.

2. The laser of claim 1 wherein said means for varying said absorbance comprises
    means for changing the absorption strength of said absorptive layers.

3. The laser of claim 1 wherein said means for varying said absorbance comprises:
    means for applying voltage to said absorptive layers.

4. The laser of claim 1 wherein said absorptive layers comprise quantum wells inside p-i-n diodes.

5. The laser of claim 1 wherein said structure has two layers that are placed at positions such that said layers are substantially equidistant from a minimum of said standing wave when said layers are of equal absorbance.

6. The laser of claim 1 wherein the thickness and the number of said semiconductor layers are selected to set predetermined wavelengths for said laser.

7. The laser of claim 1 wherein said layers are placed at positions such that said light beams are applied substantially perpendicular to said layers.

8. The laser of claim 1 wherein said layers are placed at positions such that said light beams from said laser are applied substantially parallel to said layers.

9. The laser of claim 1 wherein said tunable lasers oscillates at a particular wavelength by selectably turning on and off particular layers in said structure.

\* \* \* \* \*